United States Patent
He et al.

(10) Patent No.: US 12,557,533 B2
(45) Date of Patent: Feb. 17, 2026

(54) DISPLAY PANEL AND DISPLAY DEVICE THEREOF

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Baoke He, Beijing (CN); Duanming Li, Beijing (CN); Minghao Gao, Beijing (CN); Qin Zhang, Beijing (CN); Quanqin Sun, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 622 days.

(21) Appl. No.: 17/921,213

(22) PCT Filed: Oct. 25, 2021

(86) PCT No.: PCT/CN2021/125980
§ 371 (c)(1),
(2) Date: Oct. 25, 2022

(87) PCT Pub. No.: WO2022/134823
PCT Pub. Date: Jun. 30, 2022

(65) Prior Publication Data
US 2023/0171991 A1   Jun. 1, 2023

(30) Foreign Application Priority Data
Dec. 25, 2020 (CN) .......................... 202011566483.3

(51) Int. Cl.
*H10K 50/858* (2023.01)
*H10K 59/80* (2023.01)

(52) U.S. Cl.
CPC ......... *H10K 59/879* (2023.02); *H10K 59/873* (2023.02); *H10K 59/876* (2023.02)

(58) Field of Classification Search
CPC .. H10K 59/879; H10K 50/858; H10K 50/844; H10K 59/873; H10K 59/876
See application file for complete search history.

(56) References Cited

U.S. PATENT DOCUMENTS

2013/0335345 A1   12/2013   Liu et al.
2016/0240819 A1   8/2016   Choi et al.
(Continued)

FOREIGN PATENT DOCUMENTS

CN   103513812 A   1/2014
CN   107170775 A   9/2017
(Continued)

*Primary Examiner* — Victor A Mandala
*Assistant Examiner* — Colleen E Snow
(74) *Attorney, Agent, or Firm* — Raj S. Dave; Dave Law Group LLC

(57) ABSTRACT

The present disclosure relates to a display panel and a display device thereof. The display panel includes: a substrate; an organic light-emitting device located on the substrate; a cover layer located on the organic light-emitting device; a light extraction layer located on the cover layer; an optical functional layer located on the light extraction layer; and an encapsulation layer located on the optical functional layer. A refractive index of the light extraction layer is less than a refractive index of the cover layer and less than a refractive index of a portion of the encapsulation layer closest to the optical functional layer. A refractive index of the optical functional layer is less than the refractive index of the portion of the encapsulation layer closest to the optical (Continued)

functional layer and not equal to the refractive index of the light extraction layer.

20 Claims, 2 Drawing Sheets

(56) References Cited

U.S. PATENT DOCUMENTS

| | | | |
|---|---|---|---|
| 2017/0373277 | A1 | 12/2017 | Noh et al. |
| 2019/0157358 | A1 | 5/2019 | Maeda |
| 2022/0085333 | A1 | 3/2022 | Wen et al. |
| 2023/0180515 | A1* | 6/2023 | Heo .................... H10K 59/873 257/40 |

FOREIGN PATENT DOCUMENTS

| | | |
|---|---|---|
| CN | 107546333 A | 1/2018 |
| CN | 109449192 A | 3/2019 |
| CN | 110504382 A | 11/2019 |
| CN | 110970572 A | 4/2020 |
| CN | 111710798 A | 9/2020 |
| CN | 215008276 U | 12/2021 |

* cited by examiner

DISPLAY PANEL AND DISPLAY DEVICE THEREOF

CROSS REFERENCE TO RELATED APPLICATIONS

This patent application is the national stage entry of PCT/CN2021/125980, filed on Oct. 25, 2021, which claims the benefit and priority of Chinese Patent Application No. 202011566483.3 filed on Dec. 25, 2020, the disclosures of which are incorporated by reference herein in their entirety as part of the present application.

TECHNICAL FIELD

Embodiments of the present disclosure relate to a field of displaying technology, and particularly, relate to a display panel and a display device thereof.

BACKGROUND

Organic Light-Emitting Diode (OLED) display panels have advantages such as self-luminescence, high efficiency, bright colors, light weight, power saving, capability of crimping, and a wide operating temperature range, and have been gradually applied to fields such as large-area displaying, lighting, and onboard displaying.

SUMMARY

Embodiments of the present disclosure provide a display panel and a display device thereof.

An aspect of the present disclosure provides a display panel. The display panel includes: a substrate; an organic light-emitting device located on the substrate; a cover layer located on the organic light-emitting device; a light extraction layer located on the cover layer; an optical functional layer located on the light extraction layer; and an encapsulation layer located on the optical functional layer. A refractive index of the light extraction layer is less than a refractive index of the cover layer and less than a refractive index of a portion of the encapsulation layer closest to the optical functional layer. A refractive index of the optical functional layer is less than the refractive index of the portion of the encapsulation layer closest to the optical functional layer and not equal to the refractive index of the light extraction layer.

In an embodiment of the present disclosure, the refractive index of the optical functional layer is greater than the refractive index of the light extraction layer.

In an embodiment of the present disclosure, a difference between the refractive index of the optical functional layer and the refractive index of the portion of the encapsulation layer closest to the optical functional layer is in a range of 0.03-0.33.

In an embodiment of the present disclosure, a ratio of a thickness of the optical functional layer to a thickness of the portion of the encapsulation layer closest to the optical functional layer is in a range of 0.04-0.21.

In an embodiment of the present disclosure, a material of the optical functional layer is the same as a material of the portion of the encapsulation layer closest to the optical functional layer.

In an embodiment of the present disclosure, the material of the optical functional layer includes silicon oxynitride, wherein an oxygen content in the material of the optical functional layer is greater than an oxygen content in the material of the portion of the encapsulation layer closest to the optical functional layer.

In an embodiment of the present disclosure, a material of the optical functional layer includes silicon oxide.

In an embodiment of the present disclosure, the refractive index of the optical functional layer is less than the refractive index of the light extraction layer.

In an embodiment of the present disclosure, the encapsulation layer includes a first encapsulation layer, a second encapsulation layer and a third encapsulation layer which are sequentially arranged in a direction away from the substrate. The first encapsulation layer includes the portion of the encapsulation layer closest to the optical functional layer.

In an embodiment of the present disclosure, a refractive index of the second encapsulation layer is less than a refractive index of the first encapsulation layer and less than a refractive index of the third encapsulation layer.

In an embodiment of the present disclosure, a refractive index of the first encapsulation layer is 1.73, a refractive index of the second encapsulation layer is 1.54, and a refractive index of the third encapsulation layer is 1.84.

In an embodiment of the present disclosure, a thickness of the first encapsulation layer is 950 nm, a thickness of the second encapsulation layer is 12 μm, and a thickness of the third encapsulation layer is 700 nm.

In an embodiment of the present disclosure, a material of the light extraction layer includes an organic macromolecular material or lithium fluoride.

In an embodiment of the present disclosure, the organic light-emitting device includes an anode, an organic light-emitting layer and a cathode which are sequentially arranged in a direction away from the substrate.

An aspect of the present disclosure provides a display device. The display device includes the display panel as described above.

Further aspects and areas of applicability will become apparent from the description provided herein. It should be understood that various aspects of the present application may be implemented individually or in combination with one or more other aspects. It should also be understood that the description and specific examples herein are intended for purposes of illustration only and are not intended to limit the scope of the present application.

BRIEF DESCRIPTION OF THE DRAWINGS

The drawings described herein are for illustrative purposes only of selected embodiments and not for all possible implementations and are not intended to limit the scope of the present application.

Corresponding reference numerals indicate corresponding parts or features throughout the several diagrams of the drawings.

DETAILED DESCRIPTION

Figure 1:
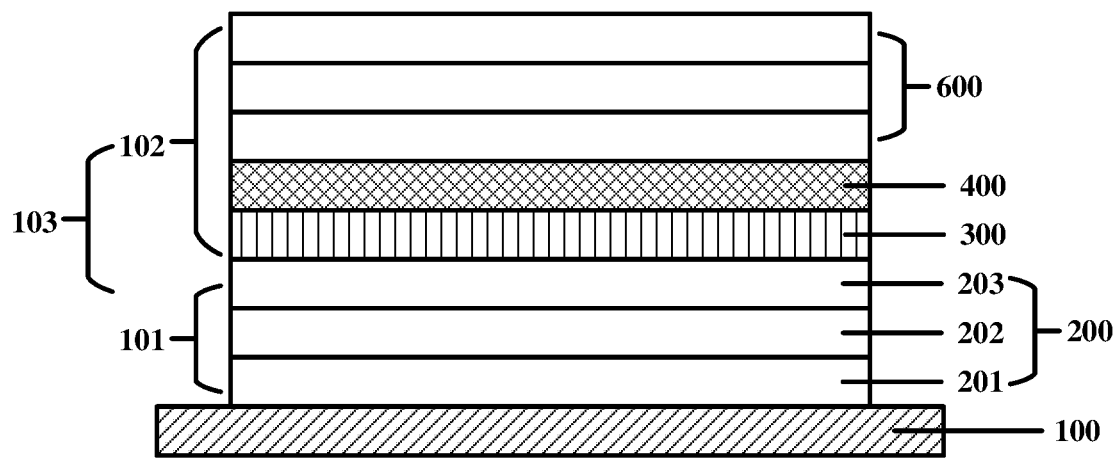
FIG. 1 is a schematic view showing a cross-sectional structure of an OLED display panel 10.

Firstly, it should be noted that, as used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively. Likewise, the terms "include", "including" and "or" should all be construed to be inclusive, unless such a construction is clearly prohibited from the context. The term "example" used herein, particularly when followed by a listing of terms, is merely exemplary and illustrative and should not be deemed to be exclusive or comprehensive.

Additionally, further to be noted, when the elements and the embodiments thereof of the present application are introduced, the articles "a/an", "one", "the" and "said" are intended to represent the existence of one or more elements. Unless otherwise specified, "a plurality of" means two or more. The expressions "comprise", "include", "contain" and "have" are intended as inclusive and mean that there may be other elements besides those listed. The terms such as "first" and "second" are used herein only for purposes of description and are not intended to indicate or imply relative importance and the order of formation.

Next, in the drawings, the thickness and area of each layer are exaggerated for clarity. It should be understood that when a layer, a region, or a component is referred to as being "on" another part, it is meant that it is directly on the another part, or there may be other components in between. In contrast, when a certain component is referred to as being "directly" on another component, it is meant that no other component lies in between.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

Exemplary embodiments will now be described more fully with reference to the accompanying drawings.

At present, as the OLED display technology is applied more and more widely, the requirements for the OLED display panel are more and more higher, wherein the hue error is an important indicator for determining the display effect. A person skilled in the field of display always focuses on the study on the technical means for inhibiting the hue error.

Researches show that the hue error of the OLED display panel is related to the microcavity effect caused by an electrode layer in the OLED device. FIG. 1 is a schematic view showing a cross-sectional structure of an OLED display panel 10. As shown in FIG. 1, the display panel 10 may include: a substrate 100, an OLED device 200 located on the substrate 100, a cover layer 300 located on the OLED device 200, a light extraction layer 400 located on the cover layer 300, and an encapsulation layer 600 located on the light extraction layer 400. The OLED device 200 may include an anode 201, a light-emitting layer 202, and a cathode 203 sequentially arranged in a direction perpendicular to the substrate 100. The cover layer 300 may be configured to prevent oxygen and moisture from entering into the display panel 10 from the outside. Additionally, the cover layer 300 may further be configured to improve the extraction efficiency of the light emitted by the light-emitting layer 202. The light extraction layer 400 may be configured to improve the extraction efficiency of light emitted from the OLED device 200. Additionally, the light extraction layer 400 may be configured to protect the cover layer 300 and the OLED device 200 from being damaged.

For the display panel, the anode 201, the light-emitting layer 202, and the cathode 203 constitute a microcavity 101. This microcavity 101 may cause the light emitted from the light-emitting layer 102 to be amplified by being repeatedly reflected and re-reflected between the anode 201 and the cathode 203 resulting in constructive interference, thereby increasing the intensity and purity of the light. However, the directionality of light will be enhanced accordingly. This results in different intensities of light along different directions, and therefore, a significant hue error phenomenon has occurred in the display panel at different angles (particularly, at large viewing angles). However, the material and parameter selection of the electrode layer and the organic light-emitting layer of the OLED device relates to various key design considerations, and therefore it is difficult to eliminate the hue error by adjusting the structure of the OLED device.

For this technical challenge, after deep research, the inventor finds that, except that the microcavity 101 formed by the electrode layers of the OLED device can cause the hue error, a stack of the transparent material located above the cathode 203 of the OLED device also has an important influence on the hue error. For example, if the cover layer 300, the light extraction layer 400, and the encapsulation layer 600 form a high-low alternating refractive index configuration, a Distributed Bragg reflector (DBR) 102 will be formed. Here, it should be understood that the Distributed Bragg reflector may be composed of high refractive index layers and low refractive index layers alternately arranged. When light passes through these film layers with different refractive indexes, the lights reflected from each layer interfere with each other due to the change in the phase angle, and then combined with each other to obtain a strong reflected light. The Bragg reflector 102 and the cathode 203 may likewise form an additional microcavity 103. Similar to the microcavity 101, the light is reflected multiple times within the microcavity 103, so that the intensity of the emitted light is increased under the action of interference superposition, and the directionality of the light is enhanced, thereby further enhancing the hue error. In addition, the presence of the microcavities 101 and 103 further reduces the light extraction efficiency of the display panel.

In order to cope with the above problems, the embodiments of the present disclosure provide a display panel, which can reduce the microcavity effect, thereby improving the hue error and increasing the light extraction efficiency.

Figure 2:
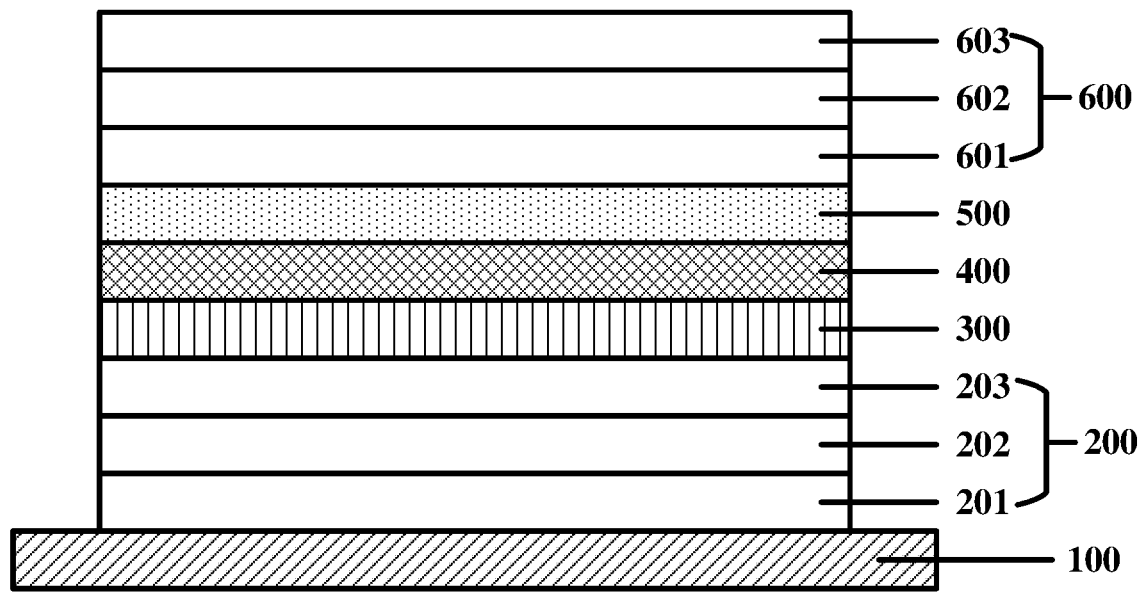
FIG. 2 is a schematic view showing a cross-sectional structure of a display panel according to an embodiment of the present disclosure.

FIG. 2 is a schematic view showing a cross-sectional structure of a display panel according to an embodiment of the present disclosure. As shown in FIG. 2, the display panel 20 may include: a substrate 100; an organic light-emitting device 200 located on the substrate 100; a cover layer 300 located on the organic light-emitting device 200; a light extraction layer 400 located on the cover layer 300; an optical functional layer 500 located on the light extraction layer 400; and an encapsulation layer 600 located on the optical functional layer 500. In an embodiment of the present disclosure, a refractive index of the light extraction layer 400 may be less than a refractive index of the cover layer 300 and less than a refractive index of a portion 601 of the encapsulation layer 600 closest to the optical functional layer 500.

In an embodiment of the present disclosure, a refractive index of the optical functional layer 500 may be less than the refractive index of the portion 601 of the encapsulation layer 600 closest to the optical functional layer 500 and not equal to the refractive index of the light extraction layer 400. By inserting the optical functional layer 500 between the light extraction layer 400 and the encapsulation layer 600, a high-low alternating refractive index configuration previously formed by the cover layer 300, the light extraction layer 400, and the encapsulation layer 600 is broken. That is, by providing the optical functional layer 500, the plurality of film layers located above the cathode 203 cannot form the Distributed Bragg reflector, and then a microcavity cannot be formed between the cathode and a dielectric stack above the cathode, thereby reducing the contribution of the dielectric stack to the hue error.

According to an embodiment of the present disclosure, after the optical functional layer 500 is provided, the number of times of back-and-forth reflection of the light between the cathode 203 and the dielectric stack above the cathode 203 is reduced, and the effect of interference superposition becomes reduced, thereby eliminating or attenuating the microcavity effect. Therefore, the hue error and the light extraction efficiency of the display panel 20 are improved, and then the display effect is improved.

According to an embodiment of the present disclosure, in order to make the cover layer 300, the light extraction layer 400, and the encapsulation layer 600 no longer meet the high-low alternating refractive index configuration, the refractive index of the optical functional layer 500 may be set to be less than the refractive index of the portion 601 of the encapsulation layer 600 closest to the optical functional layer 500 and not equal to the refractive index of the light extraction layer 400.

As an example, the refractive index of the optical functional layer 500 may be greater than the refractive index of the light extraction layer 400. As another example, the refractive index of the optical functional layer 500 may be less than the refractive index of the light extraction layer 400.

An embodiment in which the refractive index of the optical functional layer 500 is greater than the refractive index of the light extraction layer 400 is described below.

In an exemplary embodiment of the present disclosure, a difference between the refractive index of the optical functional layer 500 and the refractive index of the portion 601 of the encapsulation layer 600 closest to the optical functional layer 500 may be in a range of 0.03-0.33.

In an exemplary embodiment of the present disclosure, a ratio of a thickness of the optical functional layer 500 to a thickness of the portion 601 of the encapsulation layer 600 closest to the optical functional layer 500 may be in a range of 0.04-0.21.

In an exemplary embodiment of the present disclosure, the refractive index of the optical functional layer 500 may be in a range of 1.4-1.7. As an example, the refractive index of the optical functional layer 500 may be 1.52.

In an exemplary embodiment of the present disclosure, the thickness of the optical functional layer 500 may be in a range of 40-200 nm. As an example, the thickness of the optical functional layer 500 is 50 nm.

In an exemplary embodiment of the present disclosure, a material of the optical functional layer 500 may include silicon oxynitride or silicon oxide.

In an exemplary embodiment of the present disclosure, the material of the optical functional layer 500 may be the same as a material of the portion 601 of the encapsulation layer 600 closest to the optical functional layer 500. For example, the material of the optical functional layer 500 may include silicon oxynitride. In this case, an oxygen content in the material of the optical functional layer 500 is greater than an oxygen content in the material of the portion 601 of the encapsulation layer 600 closest to the optical functional layer 500.

It can be understood that, for example, when the materials of different film layers include silicon oxynitride, the refractive indexes of different film layers can be adjusted by adjusting the different proportions of the components included in the material. Generally, when the oxygen content in the material is adjusted to be increased, the refractive index of the corresponding film layer becomes lower.

An embodiment in which the refractive index of the optical functional layer 500 is less than the refractive index of the light extraction layer 400 is described below.

In an exemplary embodiment of the present disclosure, the refractive index of the cover layer 300 is greater than a refractive index of the cathode 203.

In an exemplary embodiment of the present disclosure, the cover layer 300 may be configured to prevent oxygen and moisture from entering into the display panel 10 from the outside, as described above. Thus, the cover layer 300 may include a material that satisfies the above-described functions. For example, the material of the cover layer 300 may include silicon nitride.

In an exemplary embodiment of the present disclosure, the refractive index of the light extraction layer 400 may be 1.35.

In an exemplary embodiment of the present disclosure, the material of the light extraction layer 400 may include an organic macromolecular material. As an example, the organic macromolecular material may include triarylamines, cyclic urea, acyl structures, dibenzothiophenes, dibenzofurans, carbazoles, and the like.

In an exemplary embodiment of the present disclosure, the material of the light extraction layer 400 may also include lithium fluoride.

In an exemplary embodiment of the present disclosure, the encapsulation layer 600 may include a first encapsulation layer 601, a second encapsulation layer 602, and a third encapsulation layer 603 sequentially arranged in a direction away from the substrate. It should be noted that, the first encapsulation layer 601 herein corresponds to the portion 601 of the encapsulation layer 600 closest to the optical functional layer 500.

In an exemplary embodiment of the present disclosure, a refractive index of the second encapsulation layer 602 may be less than a refractive index of the first encapsulation layer 601 and less than a refractive index of the third encapsulation layer 603.

In an exemplary embodiment of the present disclosure, the refractive index of the first encapsulation layer 601 may be 1.73, the refractive index of the second encapsulation layer 502 may be 1.54, and the refractive index of the third encapsulation layer 603 may be 1.84.

In an exemplary embodiment of the present disclosure, a thickness of the first encapsulation layer 601 may be 950 nm, a thickness of the second encapsulation layer 602 may be 12 μm, and a thickness of the third encapsulation layer 603 may be 700 nm.

In an exemplary embodiment of the present disclosure, a material of the first encapsulation layer 601 may include silicon oxynitride, a material of the second encapsulation layer 602 may include organic ink, and a material of the third encapsulation layer 603 may include silicon nitride.

In an exemplary embodiment of the present disclosure, the organic light-emitting device 200 may include an anode 201, an organic light-emitting layer 202, and a cathode 203 sequentially arranged in a direction away from the substrate 100.

In an exemplary embodiment of the present disclosure, a hole injection layer and a hole transport layer may be provided between the organic light-emitting layer 202 and the anode 201, and an electron transport layer and an electron injection layer may be provided between the organic light-emitting layer 202 and the cathode 203. However, the disclosure of the present disclosure is not limited thereto. In addition, the organic light-emitting layer 202 may be a single-layer structure having one light-emitting layer that emits red light, blue light, green light, or a light of similar color. Alternatively, the organic light-emitting layer 202 may have a multi-layer structure in which two or more light-emitting layers are provided.

In an embodiment of the present disclosure, a display device is further provided, which can attenuate the hue error.

Figure 3:
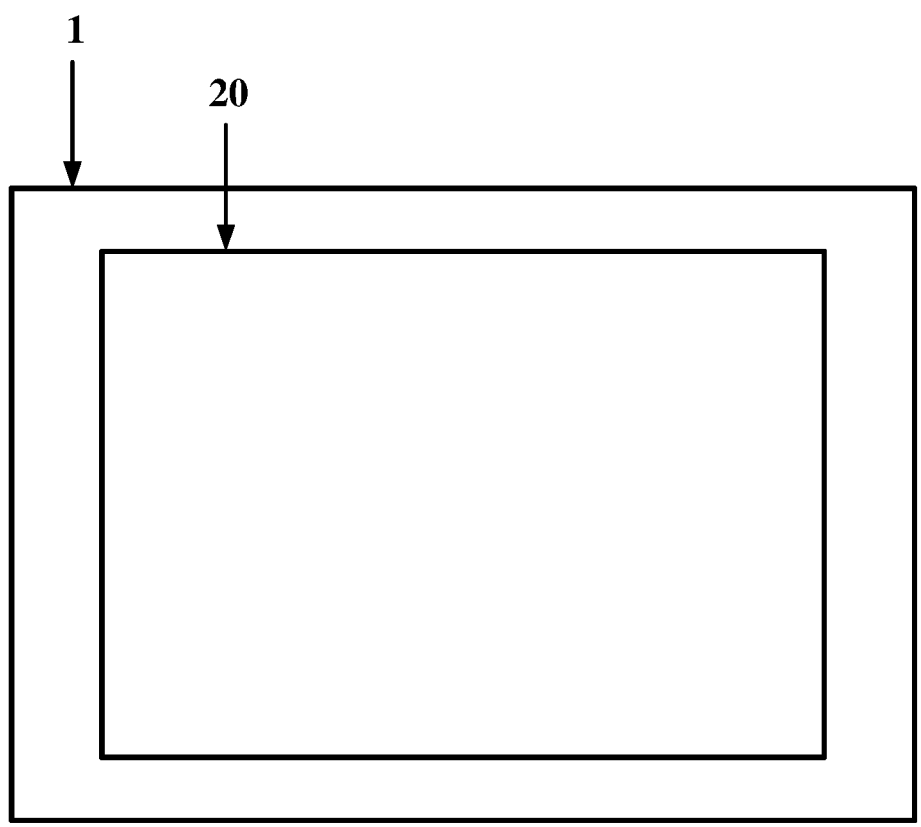
FIG. 3 is a schematic view showing a plane structure of a display device according to an embodiment of the present disclosure.

FIG. 3 is a schematic view showing a plane structure of a display device according to an embodiment of the present disclosure. As shown in FIG. 3, the display device 1 may include the display panel 20. For a description with respect to the display panel 20, reference may be made to the foregoing description, and details are not described herein again.

In an embodiment of the present disclosure, the display device 1 may be, for example, an OLED display device. As other examples, the display device 1 may be, for example, a mobile phone, a tablet computer, a television, a monitor, a notebook computer, a navigator, a wearable device, an e-book reader, and the like.

The foregoing description of the embodiment has been provided for purpose of illustration and description. It is not intended to be exhaustive or to limit the application. Even if not specifically shown or described, individual elements or features of a particular embodiment are generally not limited to that particular embodiment, are interchangeable when under a suitable condition, can be used in a selected embodiment and may also be varied in many ways. Such variations are not to be regarded as a departure from the application, and all such modifications are included within the scope of the application.

What is claimed is:

1. A display panel, comprising:
   a substrate;
   an organic light-emitting device located on the substrate;
   a cover layer located on the organic light-emitting device;
   a light extraction layer located on the cover layer;
   an optical functional layer located on the light extraction layer; and
   an encapsulation layer located on the optical functional layer,
   wherein a refractive index of the light extraction layer is less than a refractive index of the cover layer and less than a refractive index of a portion of the encapsulation layer closest to the optical functional layer,
   a refractive index of the optical functional layer is less than the refractive index of the portion of the encapsulation layer closest to the optical functional layer and not equal to the refractive index of the light extraction layer.

2. The display panel according to claim 1, wherein the refractive index of the optical functional layer is greater than the refractive index of the light extraction layer.

3. The display panel according to claim 2, wherein a difference between the refractive index of the optical functional layer and the refractive index of the portion of the encapsulation layer closest to the optical functional layer is in a range of 0.03-0.33.

4. The display panel according to claim 3, wherein a ratio of a thickness of the optical functional layer to a thickness of the portion of the encapsulation layer closest to the optical functional layer is in a range of 0.04-0.21.

5. The display panel according to claim 4, wherein a material of the optical functional layer comprises silicon oxide.

6. A display device comprising the display panel according to claim 3.

7. The display panel according to claim 2, wherein the encapsulation layer comprises a first encapsulation layer, a second encapsulation layer and a third encapsulation layer which are sequentially arranged in a direction away from the substrate, and wherein the first encapsulation layer comprises the portion of the encapsulation layer closest to the optical functional layer.

8. The display panel according to claim 2, wherein a material of the light extraction layer comprises an organic macromolecular material or lithium fluoride.

9. The display panel according to claim 2, wherein the organic light-emitting device comprises an anode, an organic light-emitting layer and a cathode which are sequentially arranged in a direction away from the substrate.

10. A display device comprising the display panel according to claim 2.

11. The display panel according to claim 1, wherein a material of the optical functional layer is the same as a material of the portion of the encapsulation layer closest to the optical functional layer.

12. The display panel according to claim 11, wherein the material of the optical functional layer comprises silicon oxynitride, and
   wherein an oxygen content in the material of the optical functional layer is greater than an oxygen content in the material of the portion of the encapsulation layer closest to the optical functional layer.

13. The display panel according to claim 1, wherein the refractive index of the optical functional layer is less than the refractive index of the light extraction layer.

14. The display panel according to claim 1, wherein the encapsulation layer comprises a first encapsulation layer, a second encapsulation layer and a third encapsulation layer which are sequentially arranged in a direction away from the substrate, and wherein the first encapsulation layer comprises the portion of the encapsulation layer closest to the optical functional layer.

15. The display panel according to claim 14, wherein a refractive index of the second encapsulation layer is less than a refractive index of the first encapsulation layer and less than a refractive index of the third encapsulation layer.

16. The display panel according to claim 14, wherein a refractive index of the first encapsulation layer is 1.73, a refractive index of the second encapsulation layer is 1.54, and a refractive index of the third encapsulation layer is 1.84.

17. The display panel according to claim 14, wherein a thickness of the first encapsulation layer is 950 nm, a thickness of the second encapsulation layer is 12 μm, and a thickness of the third encapsulation layer is 700 nm.

18. The display panel according to claim 1, wherein a material of the light extraction layer comprises an organic macromolecular material or lithium fluoride.

19. The display panel according to claim 1, wherein the organic light-emitting device comprises an anode, an organic light-emitting layer and a cathode which are sequentially arranged in a direction away from the substrate.

20. A display device comprising the display panel according to claim 1.

* * * * *